United States Patent
Theriault et al.

(10) Patent No.: US 6,622,399 B1
(45) Date of Patent: Sep. 23, 2003

(54) APPARATUS AND METHOD FOR MAINTAINING A DRY ATMOSPHERE TO PREVENT MOISTURE ABSORPTION AND ALLOW DEMOISTURIZATION OF ELECTRONIC COMPONENTS

(75) Inventors: Martin Theriault, Evanston, IL (US); Kristen Boyce, Ocoee, FL (US); Stephane Rabia, Westmont, IL (US)

(73) Assignees: l'Air Liquide-Societe Anonyme a' Directoire et Conseil de Sureveillance pour l'Etude et l'Exploitation des Procedes Georges Claude, Paris (FR); Air Liquide America, L.P., Houston, TX (US)

(*) Notice: Subject to any disclaimer, the term of this patent is extended or adjusted under 35 U.S.C. 154(b) by 228 days.

(21) Appl. No.: 09/699,001

(22) Filed: Oct. 26, 2000

Related U.S. Application Data

(60) Provisional application No. 60/193,941, filed on Mar. 31, 2000, and provisional application No. 60/193,868, filed on Mar. 31, 2000.

(51) Int. Cl.⁷ .................................................. F26B 7/00
(52) U.S. Cl. ........................................... 34/380; 34/218
(58) Field of Search ............................ 34/192, 195, 197, 34/201, 202, 218, 380, 211, 212; 62/78; 165/47 T; 312/31–31.03

(56) References Cited

U.S. PATENT DOCUMENTS

| | | | |
|---|---|---|---|
| 4,572,427 A | * 2/1986 | Selfridge et al. ............ 236/3 |
| 4,704,792 A | 11/1987 | Itagaki et al. ................ 29/741 |
| 4,815,913 A | 3/1989 | Hata et al. ................... 414/225 |
| 4,838,911 A | * 6/1989 | Robertson et al. ........... 62/3.3 |
| 5,226,713 A | * 7/1993 | Matsumura ................. 312/305 |
| 5,297,438 A | * 3/1994 | Alles et al. .................... 338/4 |
| 5,318,181 A | 6/1994 | Stover et al. ............ 206/459.1 |
| 5,364,045 A | 11/1994 | Clayton et al. .......... 242/588.6 |
| 5,364,225 A | * 11/1994 | Hecht et al. ................. 118/719 |
| 5,368,786 A | * 11/1994 | Dinauer et al. ............. 261/130 |
| 5,371,046 A | * 12/1994 | Liaw et al. .................. 438/624 |
| 5,749,234 A | * 5/1998 | Takano ......................... 62/125 |
| 5,916,513 A | 6/1999 | Mangold et al. .......... 29/25.01 |
| 5,944,602 A | * 8/1999 | Grundy ....................... 16/266 |
| 6,008,476 A | 12/1999 | Neiconi et al. ............. 219/388 |
| 6,054,682 A | * 4/2000 | Ochoa et al. ............... 219/388 |
| 6,105,606 A | * 8/2000 | Jackson ...................... 137/376 |
| 6,122,918 A | * 9/2000 | Johnson, Jr. .................. 62/3.6 |
| 6,158,146 A | * 12/2000 | Kieselbach et al. ........... 34/408 |
| 6,357,142 B1 | * 3/2002 | Bergman et al. .............. 34/410 |

FOREIGN PATENT DOCUMENTS

DE 29809169 U1 1/1998
EP 959653 A2 * 11/1999 .......... H05K/13/00

* cited by examiner

*Primary Examiner*—Ira S. Lazarus
*Assistant Examiner*—Andrea M. Ragonese
(74) *Attorney, Agent, or Firm*—Linda K. Russell

(57) ABSTRACT

The apparatus and method of the present invention relates use of a warm and dry atmosphere in electronic component storage areas. The warm and dry atmosphere provides the benefit of eliminating the baking process and other moisture management issues by removing moisture from the components. In accordance with one aspect of the present invention, a component storage system includes an enclosed component storage area and a dry gas delivery system for delivery of a dry gas to the storage area to prevent moisture from being absorbed by the components, and a temperature control system for controlling a temperature of the dry gas to about 10° C. to about 60° C.

31 Claims, 5 Drawing Sheets

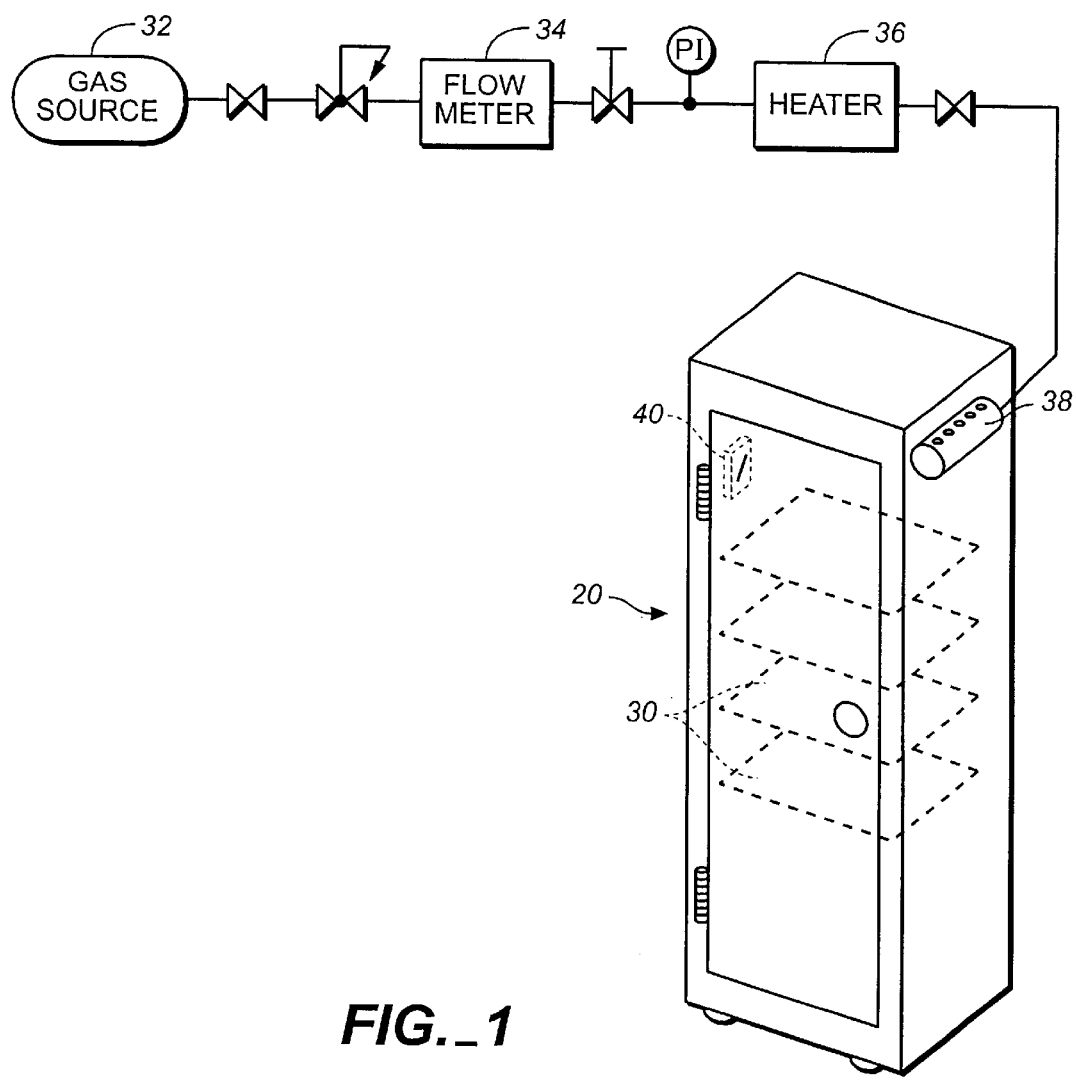
FIG._1

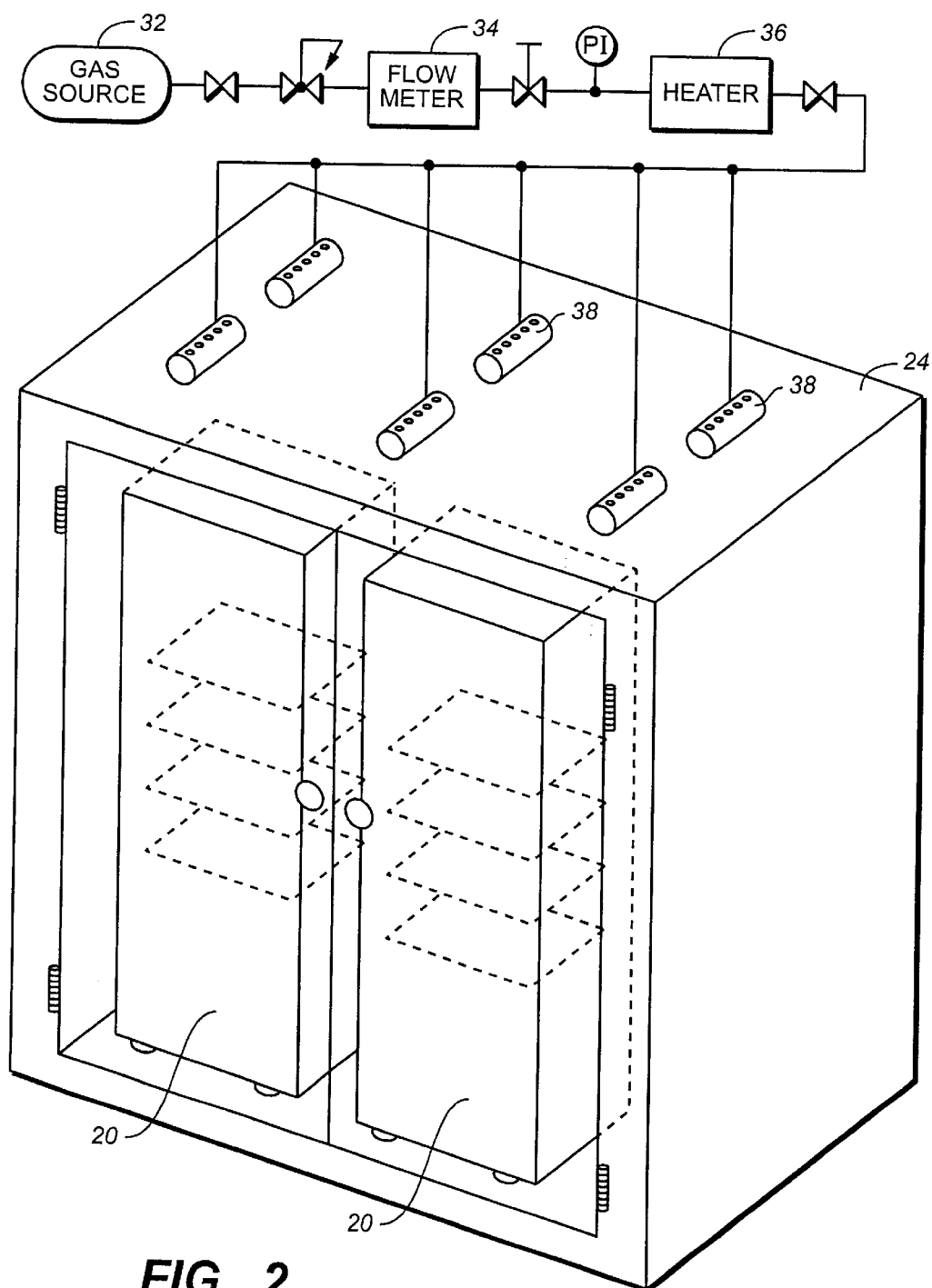
FIG._2

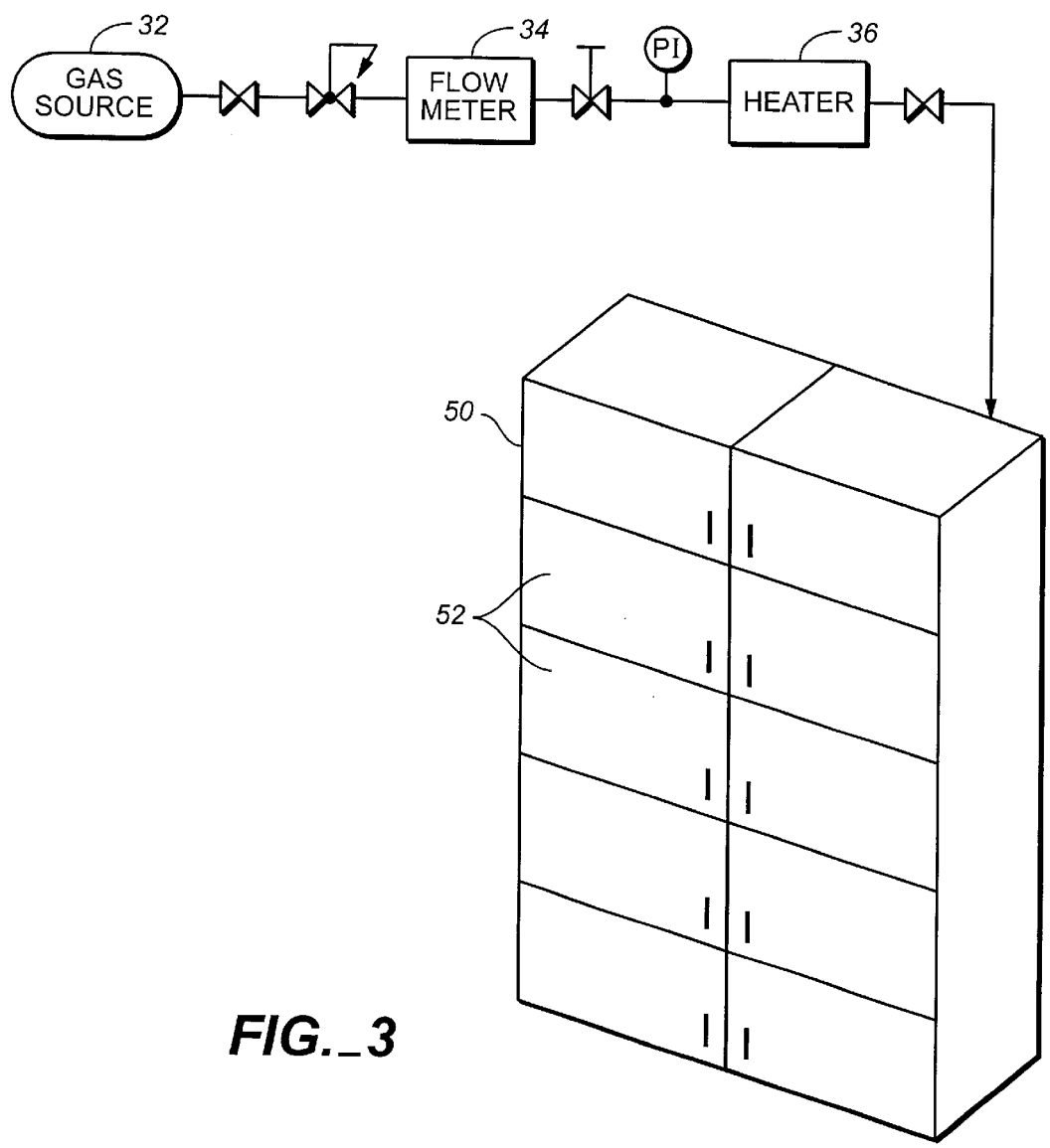
FIG._3

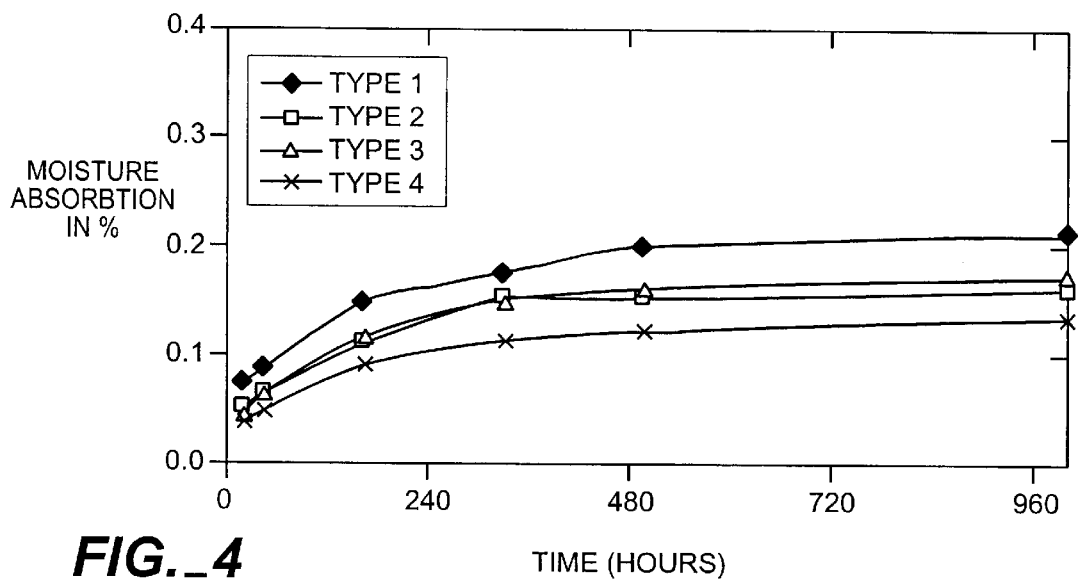
FIG._4
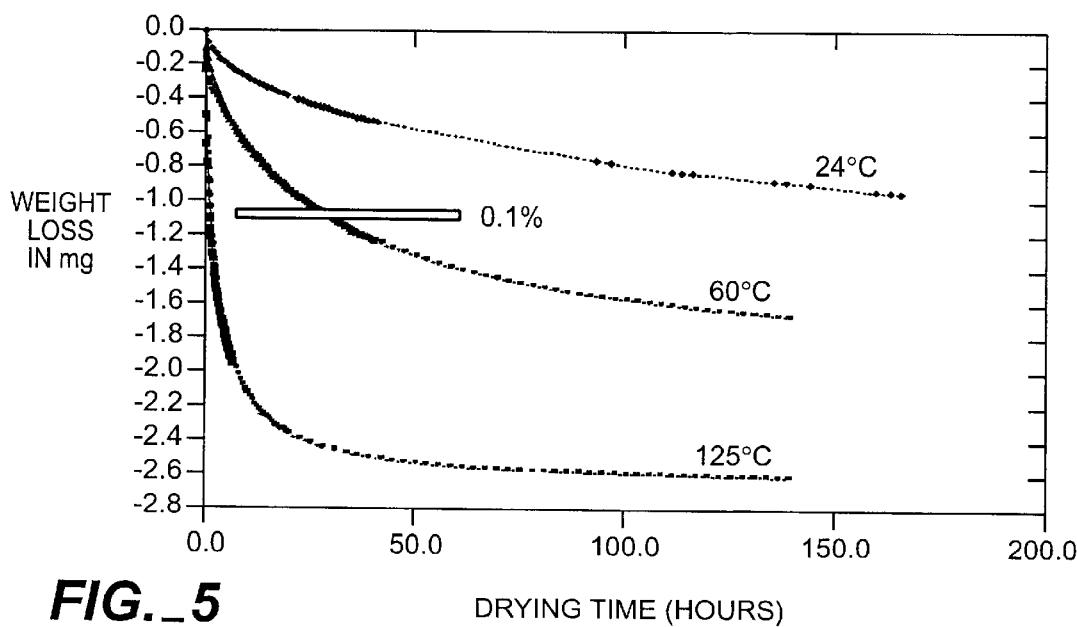
FIG._5

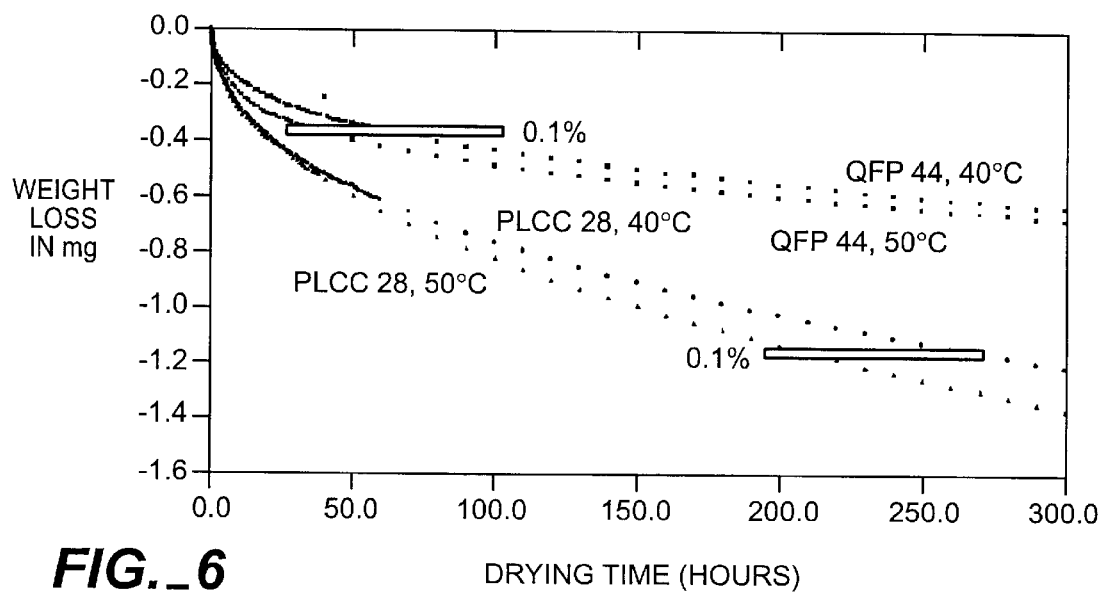
FIG._6

APPARATUS AND METHOD FOR MAINTAINING A DRY ATMOSPHERE TO PREVENT MOISTURE ABSORPTION AND ALLOW DEMOISTURIZATION OF ELECTRONIC COMPONENTS

This application claims priority to U.S. Provisional Patent Application No. 60/193,941, filed Mar. 31, 2000 and U.S. Provisional Patent Application No. 60/193,868, filed Mar. 31, 2000, which are incorporated herein by reference in their entirety.

BACKGROUND OF THE INVENTION

1. Field of the Invention

The invention relates to the field of electronic packaging and storage of electrical components, and more particularly, the invention relates to a system and method for reducing moisture in stored electrical components by maintaining a warm and dry atmosphere in a component storage area.

2. Brief Description of the Related Art

Plastic cases for electronic active components or integrated circuits are gaining in popularity over ceramic or metallic packages as they are easier to work with and less expensive. They have, however, the disadvantage of being sensitive to moisture. Moisture from atmospheric humidity is absorbed by the package via permeation. If the moisture level inside the package reaches a critical point, the device may be damaged when brought up to temperature during the reflow soldering process. These types of moisture-induced failures are referred to as the popcorning effect due to the audible popping when a crack appears in the package from moisture overpressure. If cracking occurs, air and moisture may contact the silicon die inside the package resulting in corrosion. The reliability of the product is seriously jeopardized if an integrated circuit package cracks during reflow. Micro-cracking is also hard to detect. Therefore, it is critical for printed circuit board assemblers to avoid moisture induced failures and popcorning defects and to limit the exposure of components to moisture.

There are currently no specific solutions to prevent the absorption of moisture. Assemblers normally adopt a "moisture management system" in order to control the moisture exposure levels. A part of such a system involves re-bagging the components in dry and desiccant bags after an initial usage. Another part of the current practice is to monitor floor life of a component or the time that the component is exposed to atmospheric moisture. After a floor life has expired, the moisture in the package may be reduced by performing a process referred to as "baking" during which the component is heated to remove moisture.

The limit level or critical moisture level (level at which cracking will occur) for a package depends on the package itself and the temperature at which it will be exposed during the assembly/soldering process. A higher reflow temperature results in a lower critical moisture level. The determination of the weight gain percent failure level is therefore component specific and process specific.

While baking prevents the moisture induced failure and the popcorning effect, it is time consuming and may be difficult to manage. For example, products qualifying with a moisture sensitivity corresponding to the IPC/JEDEC J-STD-020 standard are normally baked at an elevated temperature for a period varying from 24 hours (baked at 125° C.) to a week or more (baked at 40° C.). Sometimes this baking process is shortened or interrupted by the assembler because the components are urgently required to finish a production load that is back ordered. Baking also oxidizes the components and ages them by growing the intermetallic layer of the component joint structure.

As the reflow soldering temperatures are expected to increase when lead-free alloys are introduced on the market (217° C. and higher melting points for lead-free alloys versus a 183° C. melting point for standard lead alloys) moisture control will become even more critical in the future.

Dry storage cabinets are available which prevent moisture absorption. However, these dry storage cabinets have not been used to demoisturize components and eliminate the need for baking.

Accordingly, it would be desirable to provide a system which prevents moisture absorption and also removes moisture from components without baking.

SUMMARY OF THE INVENTION

The present invention relates to the use of a warm and dry atmosphere in a component storage area. The warm and dry atmosphere in the storage area provides the benefit of eliminating the baking process and other moisture management issues.

In accordance with one aspect of the present invention, a component storage system includes an enclosed component storage area, a dry gas delivery system for delivery of a dry gas to the storage area to maintain a dry atmosphere in the storage area and to prevent moisture from being absorbed by the components, and a temperature control system for controlling a temperature of the dry gas to about 10° C. to about 60° C.

In accordance with an additional aspect of the present invention, a method eliminating moisture from electronic components includes the steps of storing electronic components in a storage area, and maintaining a warm and dry atmosphere in the storage area by enclosing the storage area and injecting a warm and dry gas into the storage area at a flow rate and temperature which are controlled to eliminate moisture from the components in the storage area.

BRIEF DESCRIPTION OF THE DRAWINGS

The invention will now be described in greater detail with reference to the preferred embodiments illustrated in the accompanying drawings, in which like elements bear like reference numerals, and wherein:

FIG. 1 is schematic perspective view of a feeder cart having a warm and dry atmosphere delivered to the feeder cart;

FIG. 2 is a schematic perspective view of a feeder cart storage cabinet having a warm and dry atmosphere delivered to the storage cabinet;

FIG. 3 is a schematic perspective view of a storage cabinet for storing components having a warm and dry atmosphere delivered to the storage cabinet;

FIG. 4 is a graph of the moisture absorption in weight percent of four types of components over time in an atmosphere of 30° C. and 60% relative humidity;

FIG. 5 is a graph showing the weight loss in milligrams of components in a nitrogen atmosphere at three different temperatures; and FIG. 6 is a graph illustrating the weight loss in milligrams of two components in a nitrogen atmosphere at two different temperatures.

DETAILED DESCRIPTION OF THE PREFERRED EMBODIMENTS

The invention eliminates the need for baking to remove moisture from electronic components by storing components in a warm and dry atmosphere. The components may be stored and exposed to the warm and dry atmosphere in a feeder cart, a feeder cart cabinet, or a component storage cabinet. Surface mount devices, called components herein, are stored in trays, tapes (bobbins), sticks, bulk feeders, or the like prior to placement onto printed circuit boards (PCBs) by a placement machine. During storage, the components are generally packaged in dry bags or monitored to make sure the component floor life has not been exceeded. In the present invention, the components are stored in a dry atmosphere prior to placement and are not exposed to moisture during this storage time. Therefore, the necessity for dry bagging, tracking floor life, and/or for baking when floor life is exceeded are all eliminated.

The use of the warm and dry atmosphere in the component storage areas provides the benefit of eliminating the baking process and other moisture management issues. A dry gas according to the present invention may be defined as a gas having a relative humidity at least 10% less than a gas being replaced or as a gas having a relative humidity of about 10% or less. The invention will also have a positive effect on the quality and reliability of the assembled product by reducing the occurrence of latent defects and field failures associated with moisture overpressure. Additionally, not baking translates to lower package oxidation and better intermetallic compound which impact positively on the final product quality and reliability. With this invention, components can now be left in storage indefinitely without having to worry about moisture exposure limits and constraints.

FIGS. 1–3 illustrate three exemplary embodiments of a component storage system having a system for maintaining the stored components in a warm and dry atmosphere.

FIG. 1 illustrates a component storage system in which the components are stored in a wheeled cart 20 called a feeder cart. The cart 20 is enclosed by panels and a door which are preferably ESD dissipative. The door is provided for loading and unloading trays 30 of components from the cart 20. Gaskets and/or curtains may be used at the door and/or at other openings in the cart to provide a substantially enclosed component storage environment.

A dry atmosphere maintaining system includes a dry gas source 32, a flow meter 34 or other controller, and a heater 36 for delivering a warm and dry gas to the feeder cart 20. The dry atmosphere maintaining system may include valves, such as check valves, pressure indicators, and the like as needed. The warm and dry gas is preferably distributed in the feeder cart 20 by one or more diffuser 38 configured to distribute the delivered gas substantially uniformly around the components. An exhaust (not shown) or overpressure relief may be provided for exhausting gas from the feeder cart 20. The exhaust can also be provided through a curtain or other seal.

In operation, the dry atmosphere maintaining system is turned on to deliver warm and dry gas to the feeder cart 20. The dry gas may be nitrogen or any other dry gas including dry air. The injected dry gas displaces the humid air in the feeder cart 20 and prevents moisture absorption by the components.

The drying or moisture removal provided by the dry gas is dependant on temperature and drying time can be quite long at ambient temperature. However, if the gas is slightly warmed, the drying process is significantly faster. The dry gas is preferably heated by the heater 38 to a temperature of about 10° C. to about 60° C., and more preferably about 20° C. to about 50° C., for better efficiency. The heating is preferably carefully controlled to safe and effective temperatures for the particular components being dried.

The flow of dry gas depends on the size of the storage area and the targeted relative humidity. A flow of 100 scfh $N_2$ may be sufficient to maintain a dry atmosphere for the standard feeder cart having a volume of about 3–6 cubic feet.

Optionally, a relative humidity meter 40 can be provided for sensing a humidity of the atmosphere within the feeder cart 20 and the flow meter 40 can regulate the flow of the dry gas based on the sensed relative humidity. When the relative humidity set point is reached, the flow is intermittently turned on or off or the flow rate is adjusted to maintain the preset relative humidity point.

FIG. 2 illustrates a component storage system in which the components are stored in the wheeled feeder carts 20 and the feeder carts are placed into a dry storage cabinet 24. The dry storage cabinet 24 is configured to receive one or more of the feeder carts 24 safely and efficiently. A dry atmosphere maintaining system for delivering warm and dry gas to the storage cabinet 24 includes a gas source 32, a flow meter 34 or other controller, and a heater 36. The warm and dry gas is preferably distributed in the storage cabinet 24 by one or more diffuser 38 configured to distribute the delivered gas substantially uniformly around the components in the feeder carts 20. In operation, the dry atmosphere maintaining system is turned on to deliver warm and dry gas to the storage cabinet. The injected dry gas displaces the humid air in the storage cabinet 20 and the feeder carts 20 and prevents moisture absorption by the components in the manner described above with respect to the embodiment of FIG. 1.

FIG. 3 illustrates a component storage system in which the components are stored in a dry storage cabinet 50 having a plurality of compartments or drawers 52. The dry storage cabinet 50 is configured to receive components in any of the known component storage systems including trays, tapes (bobbins), sticks, bulk feeders or the like. A dry atmosphere maintaining system for delivering warm and dry gas to the storage cabinet 50 includes a gas source 32, a flow meter 34 or other controller, and a heater 36. The warm and dry gas is preferably distributed in the storage cabinet 50 by one or more diffuser (not shown) configured to distribute the delivered gas substantially uniformly around the components. The gas may be delivered to all compartments or delivery may be controlled so that the gas is delivered only to compartments containing components. In operation, the dry atmosphere maintaining system is turned on to deliver warm and dry gas to the storage cabinet 50. The injected dry gas displaces the humid air in the storage cabinet 50 and prevents moisture absorption by the components in the manner described above with respect to the embodiment of FIG. 1.

The invention eliminates the need to bake moisture/reflow sensitive electronic components by maintaining a dry atmosphere in the component storage area. When a low oxygen gas is used, the solderability of the components is preserved over time.

The storage of components in a dry environment can provide both moisture prevention and can dry components that have acquired some moisture. The drying time with a dry environment of nitrogen at room temperature is slightly longer than a 125° C., 24 hour baking process. However, the lower temperature nitrogen drying does not alter the component solderability or damage the integrated circuit carrier. The drying time can be shortened by heating the dry gas as will be described below.

EXAMPLE 1

FIG. 4 is a graph illustrating the saturation curves of four types of components of different inner constitutions in an atmosphere of 30° C. and 60% relative humidity. The percentages of moisture absorbed by these components ranged from about 0.12% to about 0.21% of their weight in moisture. These components would be at risk for moisture-induced failure. The 'safe' limit for these components is 0.1% moisture. Thus, to render these components damage free, it would be necessary to remove about 0.02% to about 0.11% to bring the components under the safe limit.

Plant temperatures and conditions vary, but are generally inferior to the 30° C. and 60% relative humidity conditions tested. Therefore, the goal of one embodiment of the present invention is to remove at least 0.1% of the weight of the sensitive component by dry gas storage. This does not correspond to actual drying of the component according to the standard which considers a component dry when it no longer loses water by drying at 125° C. However, removal of at least 0.1% of the weight of the sensitive component should bring the component below the 0.1% "safe limit" and avoid the risk of moisture-induces failure by eliminating a sufficient amount of moisture from a sensitive component when the floor life has expired.

EXAMPLE 2

The drying power of nitrogen as a dry gas on MS level 3 components was evaluated and is shown in FIG. 5. The drying power is evaluated at the temperatures of 24° C., 60° C., and 125° C. by measuring the weight loss of the components over time. The parts of the curves in FIG. 4 shown in full lines represent the measurements taken and the dotted lines were extrapolated using the following equation:

$$W = A \exp(B/t+F) - C$$

Where W is the weight loss in mg, t is the time in hours, and A, B, C, and F are constants determined for each curve by successive approximations.

The weight loss greatly varies according to the temperature. The 0.1% weight loss goal is obtained, as shown in FIG. 5, in a little over 150 hours at 25° C. and in only about 24 hours at 60° C.

EXAMPLE 3

FIG. 6 illustrates the drying power of nitrogen as a dry gas on two MS level 3 components. The drying power is evaluated at the temperatures of 40° C. and 50° C. by measuring the weight loss of the components over time. The parts of the curves in FIG. 6 shown in full lines represent the measurements taken and the dotted lines were extrapolated as described above. A 10° C. reduction in temperature is shown to increase the drying time required to reach the threshold of 0.1% by almost on third. This indicates the importance of optimizing the temperature parameter under the constraints posed by the storage area.

The difference between the drying times of the QFP 44 component and the PLCC 28 component is explained by the relative thicknesses of the components (1.8 mm versus 3.9 mm). The thinner the component, the more sensitive the component is to moisture and the more effective the soft drying of component with the nitrogen or other dry gas.

While the invention has been described in detail with reference to the preferred embodiments thereof, it will be apparent to one skilled in the art that various changes and modifications can be made and equivalents employed, without departing from the present invention.

What is claimed is:

1. An electronic component storage system comprising:
   an enclosed component storage area configured to enclose a plurality of electronic components;
   a dry gas delivery system for delivery of a dry gas to the storage area to maintain a dry atmosphere in the storage area and to prevent moisture from being absorbed by the electronic components; and
   a temperature control system for controlling a temperature of the dry gas to about 10° C. to about 60° C., wherein a temperature and a flow rate of the dry gas are controlled by the control system to eliminate moisture from the electronic components while the electronic components are stored in the storage area to achieve a moisture level in which moisture accounts for 0.1% or less of the weight of the electronic components.

2. The system of claim 1, wherein the component storage area is a feeder cart for storing the electronic components.

3. The system of claim 1, wherein the component storage area is a cabinet receiving at least one feeder cart for storing the electronic components.

4. The system of claim 1, wherein the component storage area is a storage cabinet for storing the electronic components.

5. The system of claim 1, wherein the temperature control system controls the temperature of the dry gas to about 20° C. to about 50° C.

6. The system of claim 1, wherein a flow rate of the dry gas delivered to the storage area is controlled by a control system including a humidity sensor within the component storage area.

7. The system of claim 1, wherein the temperature and the flow rate of the dry gas are controlled to remove about 0.1% or more of the weight of the electronic components by elimination of moisture while the components are stored in the storage area.

8. The system of claim 2, wherein the feeder cart is enclosed by panels and a door.

9. The system of claim 2, wherein the feeder cart is ESD dissipative.

10. The system of claim 1, wherein the component storage area contains at least one of the group consisting of trays, tapes, sticks, and bulk feeders containing the electronic components.

11. The system of claim 10, wherein the electronic components are surface mount devices.

12. The system of claim 11, wherein the surface mount devices include plastic cases.

13. An integrated circuit chip storage system comprising:
   an enclosed chip storage area containing a plurality of moisture sensitive integrated circuit chips;
   an inert gas delivery system for delivery of an inert gas having a relative humidity of 10% or less to the storage area to maintain a dry atmosphere in the storage area and to prevent moisture from being absorbed by the chips; and
   a temperature control system for controlling a temperature of the inert gas delivered to the storage area to a temperature of about 10° C. to about 60° C., wherein the temperature and the flow rate of the inert gas are controlled to remove about 0.1% or more of the weight of the chips by elimination of moisture while the components are stored in the storage area.

14. The system of claim 13, wherein the chip storage area is a feeder cart for storing the chips.

15. The system of claim 14, wherein the feeder cart is enclosed by panels and a door.

16. The system of claim 14, wherein the feeder cart is ESD dissipative.

17. The system of claim 13, wherein the chip storage area is a cabinet receiving at least one feeder cart storing the chips.

18. The system of claim 13, wherein the chip storage area is a storage cabinet for storing the chips in at least one of the group consisting of trays, tapes, sticks, and bulk feeders.

19. The system of claim 13, wherein the temperature control system controls the temperature of the inert gas to about 20° C. to about 50° C.

20. The system of claim 13, wherein a flow rate of the dry gas delivered to the storage area is controlled by a control system including a humidity sensor within the chip storage area.

21. The system of claim 13, wherein the electronic components are surface mount devices.

22. The system of claim 13, wherein the surface mount devices include plastic cases.

23. The system of claim 13, wherein a temperature and a flow rate of the dry gas are controlled by the control system to eliminate moisture from the chips while the chips are stored in the storage area to achieve a moisture level in which moisture accounts for 0.1% or less of the weight of the chips.

24. An electronic component storage system comprising:

an enclosed component storage area configured to enclose a plurality of electronic components;

a nitrogen gas delivery system for delivery of nitrogen gas to the storage area to maintain a dry atmosphere in the storage area and to prevent moisture from being absorbed by the electronic components; and a control system for controlling a flow of the nitrogen gas to the storage area, wherein the temperature and the flow rate of the nitrogen gas are controlled to remove about 0.1% or more of the weight of the chips by elimination of moisture while the components are stored in the storage area.

25. The system of claim 24, wherein the component storage area is a feeder cart for storing the electronic components.

26. The system of claim 24, wherein the component storage area is a cabinet receiving at least one feeder cart for storing the electronic components.

27. The system of claim 24, wherein the component storage area is a storage cabinet for storing the electronic components.

28. The system of claim 24, wherein the temperature control system controls the temperature of the nitrogen gas to about 20° C. to about 50° C.

29. The system of claim 2, wherein the feeder cart is ESD dissipative.

30. An integrated circuit chip storage system comprising:

an enclosed chip storage area containing a plurality of moisture sensitive integrated circuit chips;

an inert gas delivery system for delivery of an inert gas leaving a relative humidity of 10% or less to the storage area to maintain a dry atmosphere in the storage area and to prevent moisture from being absorbed by the chips; and a temperature control system for controlling a temperature of the inert gas delivered to the storage area to a temperature of about 10° C. to about 60° C., wherein a temperature and a flow rate of the inert gas are controlled by the control system to eliminate moisture from the chips while the chips are stored in the storage area to achieve a moisture level in which moisture accounts for 0.1% or less of the weight of the chips.

31. An electronic component storage system comprising:

an enclosed component storage area configured to enclose a plurality of electronic components;

a nitrogen gas delivery system for delivery of nitrogen gas to the storage area to maintain a dry atmosphere in the storage area and to prevent moisture from being absorbed by tile electronic components; and a control system for controlling a flow of the nitrogen gas to die storage area, wherein a temperature and a flow rate of the nitrogen gas are controlled by the control system to eliminate moisture from the chips while the chips are stored in the storage area to achieve a moisture level in which moisture accounts for 0.1% or less of the weight of the chips.

* * * * *

UNITED STATES PATENT AND TRADEMARK OFFICE
CERTIFICATE OF CORRECTION

PATENT NO.   : 6,622,399 B1
DATED        : September 23, 2003
INVENTOR(S)  : Martin Theriault, Kristen Boyce and Stephane Rabia It is certified that error appears in the above-identified patent and that said Letters Patent is hereby corrected as shown below:

Column 8,
Line 33, please delete the word "tile" and insert the word -- the --.
Line 35, please delete the word "die" and insert the word -- the --.

Signed and Sealed this

Twenty-third Day of March, 2004

JON W. DUDAS
*Acting Director of the United States Patent and Trademark Office*